United States Patent
Park et al.

(10) Patent No.: US 10,276,673 B2
(45) Date of Patent: Apr. 30, 2019

(54) SEMICONDUCTOR DIE HAVING STACKING STRUCTURE OF SILICON-METALLIC CONDUCTIVE LAYER-SILICON

(71) Applicant: MagnaChip Semiconductor, Ltd., Cheongju-si (KR)

(72) Inventors: Myung Ho Park, Cheongju-si (KR); Ui Kyu Seo, Cheongju-si (KR); Young Ho Seo, Sejong-si (KR); Jae Sik Choi, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/901,235

(22) Filed: Feb. 21, 2018

(65) Prior Publication Data
US 2019/0019871 A1   Jan. 17, 2019

(30) Foreign Application Priority Data

Jul. 13, 2017   (KR) .................. 10-2017-0089119

(51) Int. Cl.
| | |
|---|---|
| *H01L 29/417* | (2006.01) |
| *H01L 23/00* | (2006.01) |
| *H01L 29/40* | (2006.01) |
| *H01L 29/78* | (2006.01) |
| *H01L 23/535* | (2006.01) |

(52) U.S. Cl.
CPC ...... *H01L 29/41741* (2013.01); *H01L 23/535* (2013.01); *H01L 24/05* (2013.01); *H01L 29/407* (2013.01); *H01L 29/7809* (2013.01); *H01L 29/7813* (2013.01); *H01L 2224/0401* (2013.01); *H01L 2224/05009* (2013.01); *H01L 2224/05025* (2013.01); *H01L 2224/05093* (2013.01)

(58) Field of Classification Search
CPC . H01L 29/41741; H01L 23/535; H01L 24/05; H01L 29/407; H01L 29/7809; H01L 29/7813; H01L 2224/0401; H01L 2224/05009; H01L 2224/05025; H01L 2224/05093
USPC ................................. 257/247, 331
See application file for complete search history.

(56) References Cited

U.S. PATENT DOCUMENTS

| | | | | |
|---|---|---|---|---|
| 5,796,125 A | * | 8/1998 | Matsudai | ............ H01L 29/0696 257/141 |
| 8,487,371 B2 | * | 7/2013 | Kinzer | .............. H01L 29/41766 257/330 |

(Continued)

*Primary Examiner* — Hrayr A Sayadian
(74) *Attorney, Agent, or Firm* — NSIP Law

(57) ABSTRACT

The description relates to a semiconductor die having a stacking structure of silicon-metallic conductive layer-silicon, and the semiconductor die according to embodiments includes a stacking structure of first semiconductor layer-metallic conductive layer-second semiconductor layer, and first and second power semiconductor devices in the first semiconductor layer, in which the first power semiconductor device includes a first source bump and a first gate bump, first trench gate electrodes under the first source bump, and a first channel among the plurality of first trench gate electrodes, in which the second power semiconductor device includes a second source bump and a second gate bump, second trench gate electrodes under the second source bump, and a second channel among the plurality of second trench gate electrodes, and in which the metallic conductive layer includes a metal layer.

11 Claims, 7 Drawing Sheets

(56) References Cited

U.S. PATENT DOCUMENTS

2009/0065864 A1\* 3/2009 Lee ..................... H01L 21/743
  257/343
2010/0176447 A1\* 7/2010 Takaishi ............. H01L 29/7828
  257/334

\* cited by examiner

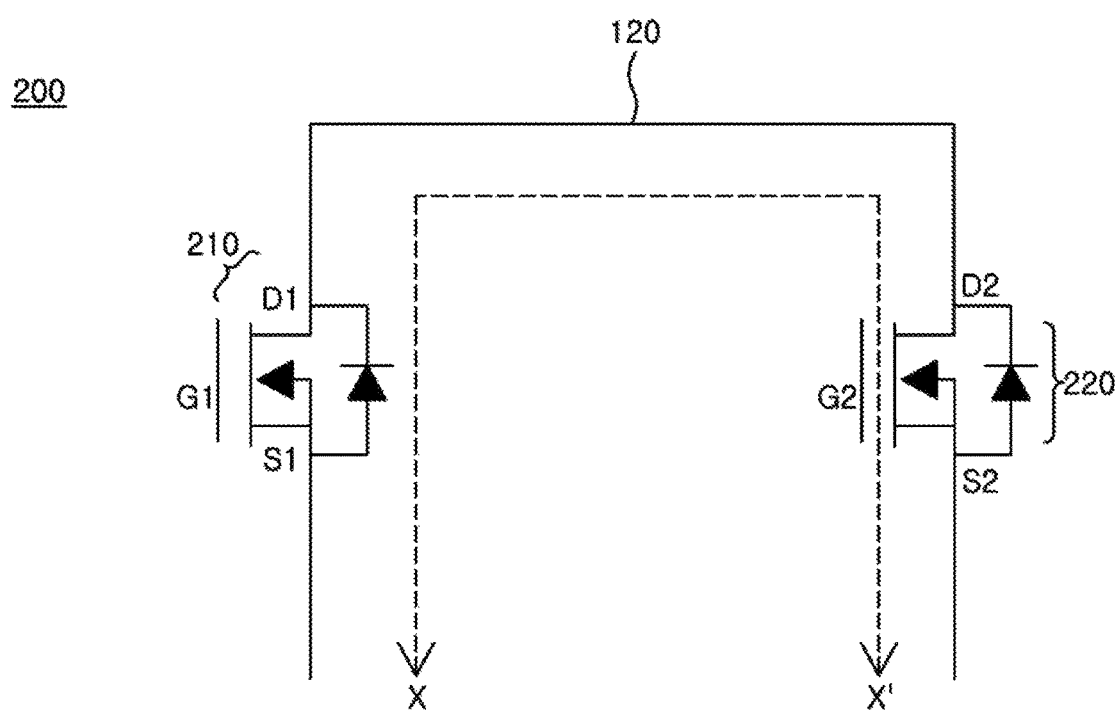

200

SEMICONDUCTOR DIE HAVING STACKING STRUCTURE OF SILICON-METALLIC CONDUCTIVE LAYER-SILICON

CROSS-REFERENCE TO RELATED APPLICATIONS

This application claims the benefit under 35 U.S.C. § 119(a) of Korean Patent Application No. 10-2017-0089119 filed on Jul. 13, 2017 in the Korean Intellectual Property Office, the entire disclosure of which is incorporated herein by reference for all purposes.

BACKGROUND

1. Field of the Disclosure

In an aspect, the description relates to a semiconductor die having a stacking structure of silicon-metallic conductive layer-silicon. The disclosure relates to a semiconductor die having stacking structure of silicon-metallic conductive layer-silicon, establishing a bidirectional current path through the metallic conductive layer formed between the silicon, and preventing wafer bending.

2. Background

It can be advantageous in the semiconductor industry to minimize a semiconductor die as much as possible. Demand for minimization is increasing particularly in the semiconductor die package industry. A Package refers to a plastic or ceramic casing so that an integrated circuit chip in which a micro circuit is designed is installed and used in electronic equipment. Packages of the related art have a much larger size, considering the size of an integrated circuit equipped therein. Therefore, reducing the size of a package to a chip size level is one of the concerns of package engineers, and a new type of package recently developed from this background is a chip-scale-package (or chip-size-package).

Among them, a Wafer Level Chip Scale Package (WLCSP) is characterized in that it is assembled and manufactured in the state of a wafer (or substrate) on which a semiconductor die is formed. The WLCSP is a smallest chip sized package and has an advantage of superior electrical characteristics and low-cost production.

A general substrate used for WLCSP for power semiconductor devices is very thin, and there is a back metal layer on a back side of a substrate in the WLCSP for power semiconductor devices.

In manufacturing processes of a power semiconductor device of the related art, a power semiconductor device is formed on a substrate first, and then a grinding process of a substrate back side is executed; as a result, the substrate is very thin, less than 200 μm, and a back metal layer is formed in this thin substrate. This thin substrate less than 200 μm causes a bending phenomenon which leads to stress on the semiconductor die and also makes it hard to conduct a subsequent packaging process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor die includes a stacking structure including a first semiconductor layer disposed over a second semiconductor layer; and a metallic conductive layer between the first semiconductor layer and the second semiconductor layer, first and second power semiconductor devices in the first semiconductor layer, a first source bump and a first gate bump on the first semiconductor layer, first trench gate electrodes under the first source bump, a first channel between the first trench gate electrodes, a second source bump and a second gate bump on the first semiconductor layer, second trench gate electrodes under the second source bump; and a second channel between the second trench gate electrodes.

The semiconductor die may further include a first barrier metal layer on a front side of the metallic conductive layer and a second barrier metal layer on a back side of the metallic conductive layer.

The semiconductor die may have the first semiconductor layer with a thinner thickness than the second semiconductor layer, and which is less than or equal to about 20 μm thick.

The semiconductor die may have a bidirectional current path disposed through the metallic conductive layer.

The semiconductor die may have first and second source bumps which are electrically connected to a source region on a side of the trench gate electrodes.

The semiconductor die may have first and second source bumps which are electrically connected to the first and second trench gate electrodes, respectively.

The semiconductor die may further include first dummy trench gate electrodes adjacent to the first trench gate electrodes, and second dummy trench gate electrodes adjacent to the second trench gate electrodes.

The semiconductor die may include third and fourth source bumps on the first semiconductor layer.

The semiconductor die may include a first source electrode connected to the first source bump and a second source electrode connected to the second source bump.

The semiconductor die may include a first solder ball connected to the first source bump and a second solder ball connected to the second source bump.

The semiconductor die may include a metallic conductive layer comprising graphene.

In another general aspect, a semiconductor die includes a first semiconductor layer disposed over a second semiconductor layer, a metallic conductive layer between the first semiconductor layer and the second semiconductor layer, a power semiconductor device in the first semiconductor layer, a gate bump, source bump, and drain bump on a front side of the first semiconductor layer, a source electrode under the source bump, a trench gate electrode under the source bump, a channel region adjacent to the trench gate electrode; and a drain connection region in the first semiconductor layer and contacting the metallic conductive layer.

The semiconductor die may include a metallic conductive layer including a first barrier metal layer, a second barrier metal layer, and a conductive metal layer between the first barrier metal layer and the second barrier metal layer.

The semiconductor die may include a dummy trench gate electrode adjacent to the trench gate electrode.

The semiconductor die may include a metallic conductive layer including graphene.

The semiconductor die may include a dummy trench gate electrode overlapping the source electrode.

The semiconductor die may have a first semiconductor layer less than or equal to about 200 μm thick.

The semiconductor die may have a resistance between the first source electrode and the second source electrode that is less than or equal to about 10 mΩ.

The semiconductor die may have a resistance between the first source electrode and the second source electrode of less than or equal to about 5 mΩ.

Embodiments are described to provide a semiconductor die that does not require a process for grinding a back side of a substrate.

Embodiments are described to provide a semiconductor die helping to prevent a substrate from being stressed and bent resulting from a backside grinding process.

Embodiments are described to provide a power semiconductor device having stacking structure of silicon 1-metallic conductive layer-silicon 2 and provide a semiconductor die facilitating subsequent processes.

Embodiments are described to provide, in the case of an application for which a Wafer Level Chip Scale Package is used together with other chips, a semiconductor die that may easily implement various applications by changing locations of source bumps and drain bumps based on a combination with other chips.

Embodiments may lower an on-state resistance via a semiconductor die having stacking structure of a silicon-conductive-silicon.

In embodiments, a semiconductor die having stacking structure of a silicon-conductive-silicon may not require a backside grinding process. As a result, embodiments may enable to decrease stress on the semiconductor die.

Other features and aspects will be apparent from the following detailed description, the drawings, and the claims.

BRIEF DESCRIPTION OF THE DRAWINGS

FIG. 1 is a circuit diagram illustrating an embodiment of a semiconductor circuit having a stacking structure of silicon-metallic conductive layer-silicon according to one or more embodiments.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 2A:
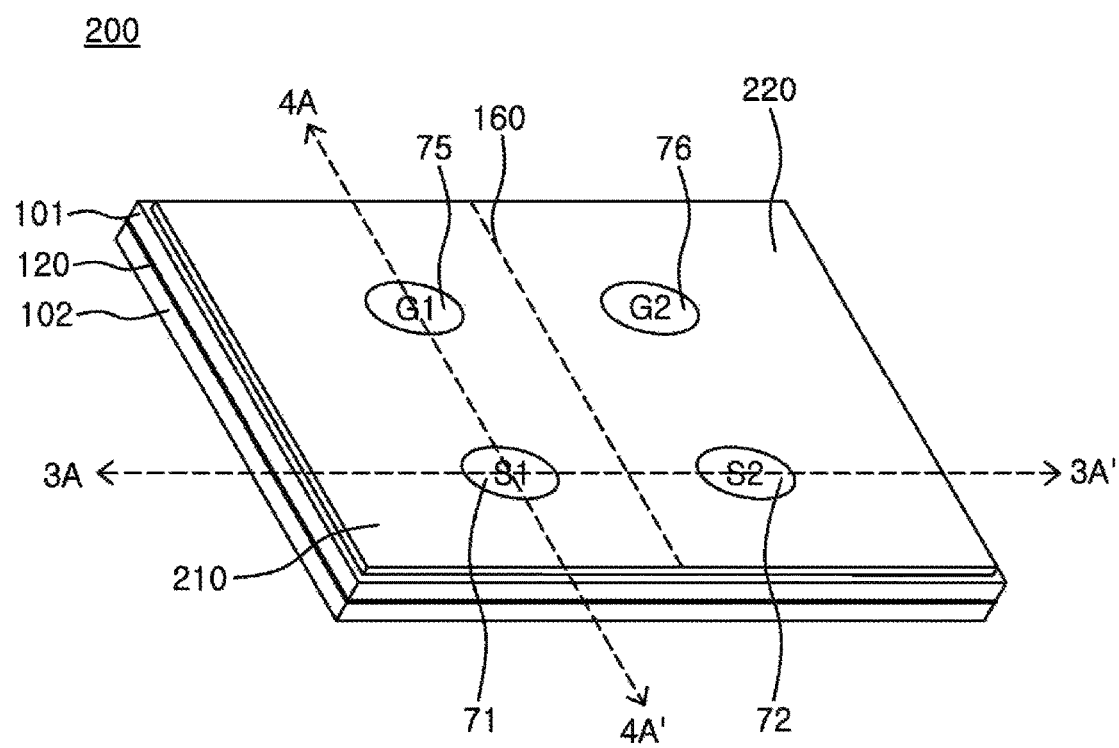
FIGS. 2A and 2B are perspective diagrams illustrating an embodiment of a semiconductor die having a stacking structure of silicon-metallic conductive layer-silicon.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a circuit diagram illustrating an embodiment of a semiconductor having a stacking structure of silicon-metallic conductive layer-silicon.

As illustrated in FIG. 1, a circuit diagram 100 shows two trench MOSFETs 210, 220 and each MOSFET has gate electrode G1 or G2, source electrode S1 or S2 and drain electrode D1 or D2. The first power semiconductor device 210 and the second power semiconductor device 220 are connected to each other using a common drain electrode 120.

The first power semiconductor device 210 has an n-type first channel. In the first power semiconductor device 210, there are a first source electrode S1, a first drain electrode D1, and a first gate electrode G1. The second power semiconductor device 220 has an n-type second channel.

In the second power semiconductor device 220, there are a second source electrode S2, a second drain electrode D2, and a second gate electrode G2. The first source electrode S1 of the first power semiconductor device 210 is electrically separated from the second source electrode S2 of the second power semiconductor device 220. Instead, the first drain electrode D1 and the second drain electrode D2 are electrically connected to each other through the common drain electrode 120.

With respect to the first and second power semiconductor devices 210, 220, a power semiconductor or a semiconductor used as a power Management Integrated Circuit (PMIC) may be used. For example, a vertical-type trench MOSFET device or Insulated Gate Bipolar Transistor (IGBT) may be used as the first and second power semiconductor devices 210, 220. Additionally, power CMOS or LDMOS devices may be used.

An important thing may be that low resistance is desirable. Since two semiconductors are connected to each other, it is important to decrease the resistance of common drain electrode 120. For that reason, the resistance between the first source electrode S1 and second source electrode S2 may be less than or equal to about 10 mΩ when switch is on.

A dotted arrow (X↔X') describes a current path when the semiconductor die 200 is on. When the first and second power semiconductor devices 210, 220 are turned on, a current path is established in which a current flows in the following direction: first source electrode S1 of first power semiconductor device 210→first drain electrode D1→common drain electrode 120→second drain electrode D2 of second power semiconductor device 220→second source electrode S2.

If necessary, there may be established a current path in which a current flows in the opposite direction: second source electrode S2 of second power semiconductor device 220→second drain electrode D2→common drain electrode 120→first drain electrode D1 of first power semiconductor device 210 →first source electrode S1. As described above, an embodiment is characterized by having bidirectional current flow. These dual n-channel Power MOSFET devices or power semiconductors enable battery life of small devices to be extended.

Consequently, current always passes through the common drain electrode 120 which is the longest in the current path. Therefore, it is important to decrease the resistance of common drain electrode 120. The resistance between the first source electrode S1 and second source electrode S2 is less than or equal to 10 mΩ, or even less than or equal to 5 mΩ.

Figure 2B:
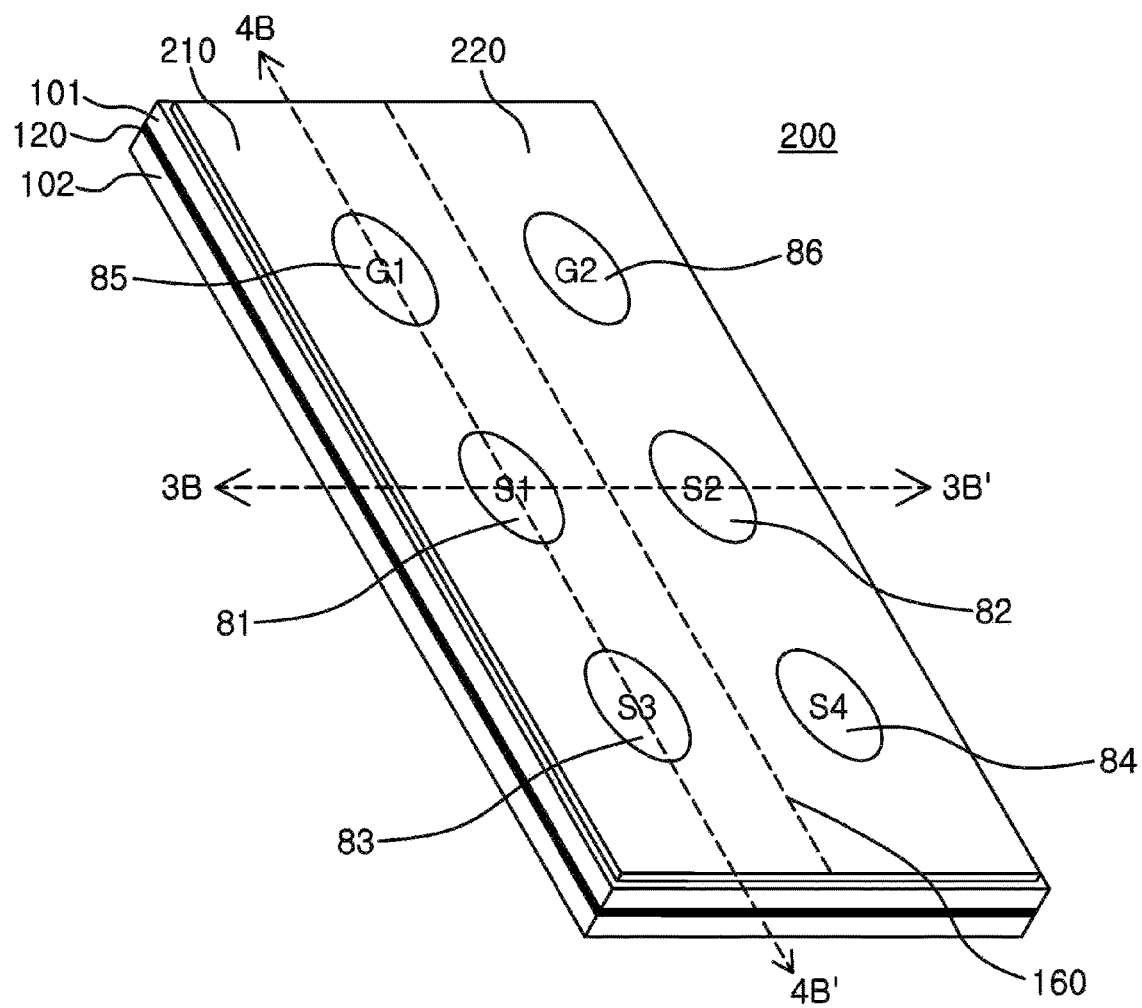

FIGS. 2A and 2B are perspective diagrams illustrating an embodiment of a semiconductor die having a stacking structure of silicon-metallic conductive layer-silicon.

As illustrated in FIG. 2A, A semiconductor die 200 having a stacking structure of silicon-metallic conductive layer-silicon according to an embodiment includes a first power semiconductor device 210 and a second power semiconductor device 220. The semiconductor die 200 has a stacking structure comprising top silicon 101, metallic conductive layer 120, and bottom silicon 102. The top silicon 101 and bottom silicon 102 can also be referred to as a first semiconductor layer and a second semiconductor layer, respectively. Here, the first/second semiconductor layers 101, 102 are formed of doped or undoped semiconductor layers. The first semiconductor layer 101 has higher doping concentration than that of the second semiconductor layer 102.

The metallic conductive layer 120 is formed between the first semiconductor layer 101 and the second semiconductor layer 102. The metallic conductive layer 120 is used for a common drain electrode of the power semiconductor devices 210, 220. The two power semiconductor devices 210, 220 are disposed side by side in the first semiconductor layer 101, and two trench semiconductor devices 210, 220 are physically separated by an imaginary reference line 160.

The semiconductor die 200 includes a first source bump 71 and a first gate bump 75, and it includes a first channel between the first trench gate electrodes formed under the first source bump 71.

The semiconductor die 200 includes a second source bump 72 and a second gate bump 76, and it includes a second channel between the second trench gate electrodes formed under the second source bump 72.

The metallic conductive layer 120 used for the semiconductor die 200 having a stacking structure of silicon-metallic conductive layer-silicon according to an embodiment is inserted into the semiconductor die 200 in the form of a tunnel.

Consequently, there is formed a current path from the first source bump 71 to the second source bump 72 passing through the metallic conductive layer 120. On contrary, there may be formed a current path from the second source bump 72 to the first source bump 71 passing through the metallic conductive layer 120.

FIG. 2B is a perspective diagram of a semiconductor die having a stacking structure of silicon-metallic conductive layer-silicon according to an embodiment.

As illustrated in FIG. 2B, a semiconductor die 200 having a stacking structure of silicon-metallic conductive layer-silicon according to an embodiment includes a metallic conductive layer 120 between a first semiconductor layer 101 and a second semiconductor layer 102. Here, the metallic conductive layer 120 is inserted in the form of a tunnel. The semiconductor die 200 includes a first power semiconductor device 210 and a second power semiconductor device 220. The two power semiconductor devices are formed side by side in the first semiconductor layer 101, and two trench semiconductor dies are physically separated by an imaginary reference line 160.

The semiconductor die 200 includes first and third source solder balls 81, 83 and a first gate solder ball 85, and it includes a first channel between the plurality of first trench gate electrodes under the first and third source solder balls.

The semiconductor die 200 includes second and fourth source solder balls 82, 84, and it includes a second channel between the plurality of second trench gate electrodes under the second and fourth source solder balls.

Contrary to the above embodiment of FIG. 2A, the semiconductor die 200 includes one more source solder ball, which is in order to obtain a lower source resistance. The greater the number of solder balls, the more area is covered.

In the semiconductor die 200, there are first and second source solder balls 81, 82 and third and fourth source solder balls 83, 84, and first and second gate solder balls 85, 86. Each gate solder balls 85, 86 and source solder balls 81 to 84 are on a front side of the first semiconductor layer 101. A bidirectional current path is formed between the first and third source solder balls 81, 83 and the second and fourth source solder balls 82, 84 on the front side. In other words, a bidirectional current path is formed between the first source solder ball 81 and the second source solder ball 82. In the same manner, a bidirectional current path is formed between the third source solder ball 83 and the fourth source solder ball 84.

Figure 3A:
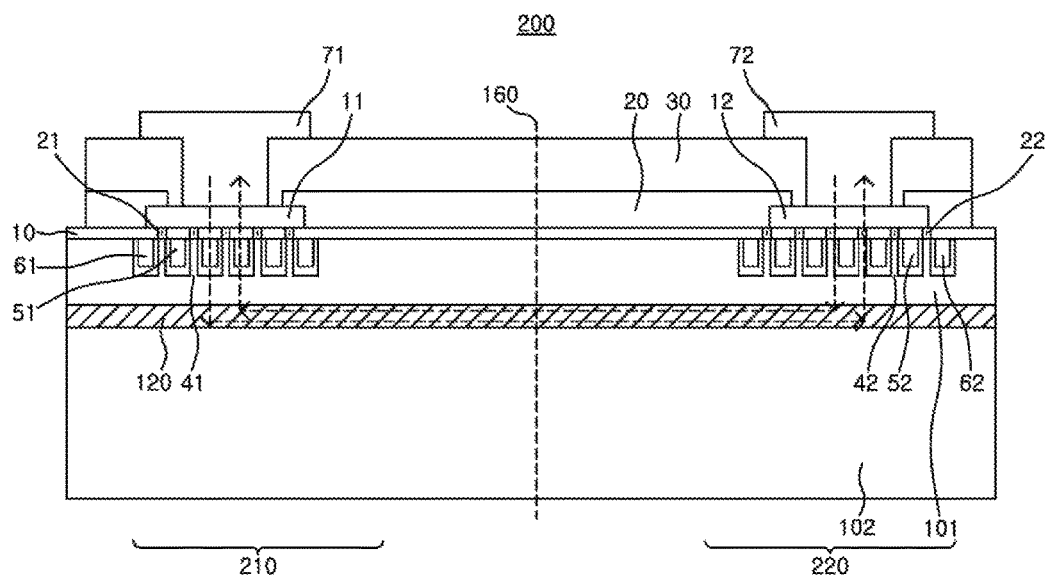
FIGS. 3A and 3B are cross sections along with a bidirectional current path illustrating an embodiment of a semiconductor die having a stacking structure of silicon-metallic conductive layer-silicon.
Figure 3B:
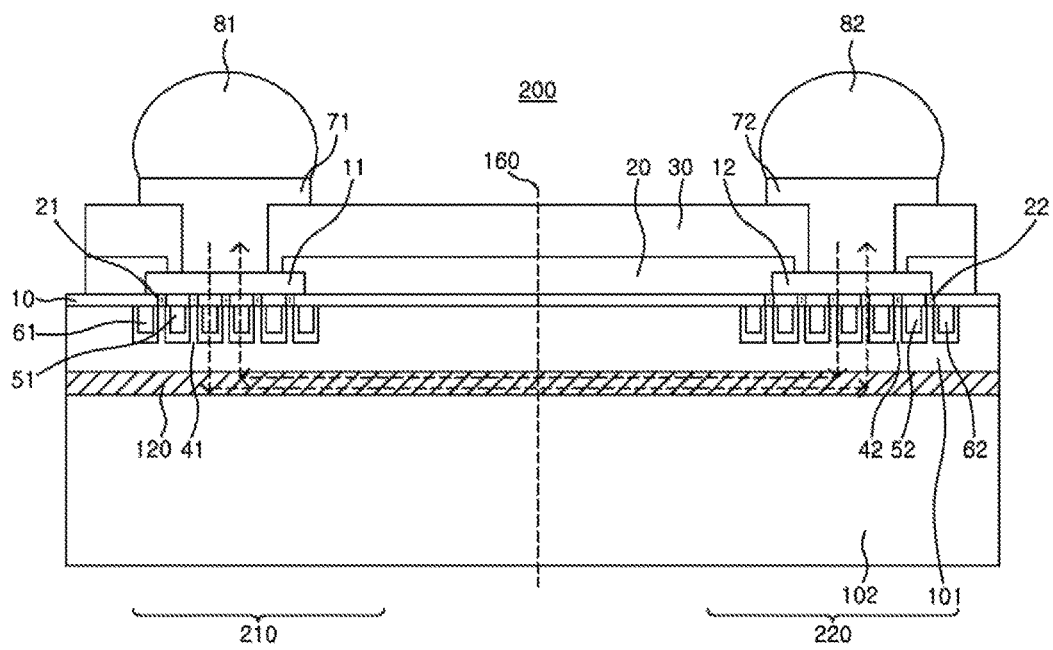

FIGS. 3A and 3B are cross sections along with a bidirectional current path illustrating an embodiment of a semiconductor die having a stacking structure of silicon-metallic conductive layer-silicon FIG. 3A is a cross section of FIG. 2A along line 3A-3A'. A semiconductor die 200 includes a first semiconductor layer 101 and a second semiconductor layer 102, and a metallic conductive layer 120 is formed between the first and second semiconductor layers 101, 102. The semiconductor die 200 may be referred to as semiconductor chip. In the first semiconductor layer 101, there are two power semiconductor devices, that is, first and second power semiconductor device 210, 220, and there are first and second trench gate electrodes 51, 52, a first source electrode 11, and a second source electrode 12. Here, both of the first and second source electrodes include metal material, and they may be referred to as metal pads. Each source electrode is insulated from each trench gate electrode by an interlayer insulating layer 10. The semiconductor die 200 may further include a protection layer 20, a polyimide layer 30, a first source bump 71, a second source bump 72, and a solder ball.

Hereinafter, each elements of the semiconductor die 200 of FIG. 3A are described in detail.

The semiconductor die 200 includes a first semiconductor layer 101 and a second semiconductor layer 102, and a metallic conductive layer 120 is formed between the first and second semiconductor layers 101, 102. The metallic conductive layer 120 is formed in the form of a conductive film between the first and second semiconductor layers 101, 102. In the first semiconductor layer 101, the first and second power semiconductor devices 210, 220 such as trench MOSFET, IGBT, or vertical MOSFET, and so on. The details of trench gate electrodes and gate/drain/source bumps composing the first and second power semiconductor devices 210, 220 are described below.

The thickness of the first semiconductor layer 101 is less than that of the second semiconductor layer 102, and it may be less than about 200 μm. The first semiconductor layer 101 also may have a thickness of less than 20 μm. The thinner the first semiconductor layer 101 is, the better it is. That is because the resistance of drift that is the movement of an electron or a hole carrier is lower. The first semiconductor layer 101 is an active region, and it has a concentration higher than a predetermined value. The second semiconductor layer 102 is a dummy semiconductor die 200 that has a resistance value higher than a predetermined value. The second semiconductor layer 102 has a resistance value to enable a current not to leak in a current path of the metallic conductive layer 120. An epitaxial semiconductor die which is the first semiconductor layer 101 is an active region and needs to control concentration, and it has resistivity of 0.05~0.5 Ωcm. If a silicon of the first semiconductor layer 101 is thin, a resistance may decrease. If the first semiconductor layer has a relatively thin thickness, a resistance of current path between the first trench gate electrodes 51 is decreased. Embodiments may reveal the same characteristics in spite of a shorter path. The thickness of the second semiconductor layer 102 is not limited to a specific value. The second semiconductor layer 102 supports the first semiconductor layer 101 and, it is not necessary to control concentration. The second semiconductor layer 102 is a kind of support dummy wafer.

The metallic conductive layer 120 is inserted into the semiconductor die 200 to form a current path. Among a first source bump 71 and a second source bump 72, there is formed a bidirectional current path from one to the other one through the metallic conductive layer 120. For example, there may be formed a current path in which a current flows in the following direction: first source bump 71→first source electrode 11→first channel region 41→metallic conductive layer 120→second channel region 42→second source electrode 12→second source bump 72. On the contrary, there may be formed a current path in which a current flows in the following direction: second source bump 72→second source electrode 12→second channel region 42→metallic conductive layer 120→first channel region 41→first source electrode 11→first source bump 71.

The metallic conductive layer 120 includes metal material having a melting point higher than a predetermined temperature. Alternatively, the metallic conductive layer 120 may be implemented as a conductive film of graphene. In an example, the metallic conductive layer 120 may desirably endure the highest temperature range for a manufacturing process (e.g., approximately 1000~1151° C.). That is, the manufacturing temperature exceeds over 1000° C. After trench process, oxidation process is conducted at the temperature exceeding 1000° C. In order for an epitaxial semiconductor die to spread, the operation is conducted at a temperature of about 1100° C.

In an example, each of the front and back sides of the metallic conductive layer 120 may include a barrier metal layer because a barrier metal layer may be desired in order for the metallic conductive layer 120 to prevent from reacting with a silicon substrate. The metallic conductive layer 120 may have a structure of first barrier metal layer-metal layer-second barrier metal layer. As the barrier metal layer, TiN, TaN, Ta, Ti, TiSi, TaSi, WN, WSi, PtSi, PdSi, CoSi2, TiSi, NiSi, and so on may be used. As the metal layer, Pt, Pd, Co, Ni, Au, Ru, Mo, Ag or an alloy thereof, and Cu, Al, Al—Cu, and so on may be used.

In an embodiment, a first source bump 71 and a second source bump 72 may be formed on a first source electrode 11 and a second source electrode 12, respectively. The first source bump 71 and second source bump 72 may include a solderable metal layer. The solderable metal layer may be stacked in order of Cu, Ni, and Au. Any metal with superior electrical conductivity may be used instead of Cu. A solder ball (not illustrated) may be formed on each individual first and second source bumps 71 and 72. The solder ball is optional, so it may not be stacked.

The first source electrode 11 is separated from the second source electrode 12 in the first semiconductor layer 101. A plurality of first and second trench gate electrodes 51, 52 are under the first source electrode 11 and the second source electrode 12. The first and second trench gate electrodes 51, 52 are needed for channel establishment. For example, a plurality of first trench gate electrodes 51 are under the first source electrode 11, and a plurality of first channel regions 41 are between the plurality of first trench gate electrodes 51. The plurality of first channel regions 41 is electrically connected to the first source electrode 11 through a first source contact plug 21 in an interlayer insulating layer 10.

In the same manner, a plurality of second trench gate electrodes 52 are under the second source electrode 12, and a plurality of second channel regions 42 are between the plurality of second trench gate electrodes 52. Therefore, each channel region is used as a current path. The plurality of second channel regions 42 is electrically connected to the second source electrode 12 through a second source contact plug 22 in the interlayer insulating layer 10. The interlayer insulating layer 10 is needed for separation between source electrodes 11, 12 and gate electrodes 51, 52. Here, the source electrodes 11, 12 include Al, Cu, Al—Cu, and so on, and gate electrodes 51, 52 include polysilicon.

Figure 7:
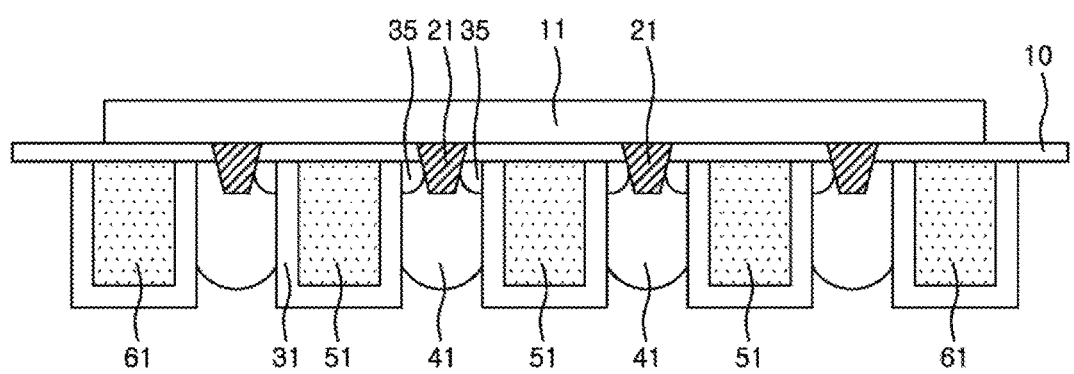
FIG. 7 is a cross section illustrating a semiconductor die that magnifies around the source electrode in FIG. 3A or 3B.

First and second dummy trench gate electrodes 61, 62 are next to first and second trench gate electrodes, respectively. The first and second dummy trench gate electrodes 61, 62 may overlap the source electrodes 11, 12. However, there is no channel next to the first and second dummy trench gate electrodes 61, 62 because an N+ source region 35 is not formed next to the first and second dummy trench gate electrodes 61, 62 as illustrated in FIG. 7. Here, FIG. 7 is a magnified image of FIG. 3A showing a first source electrode 11 and around channel regions. The source electrodes 11, 12 are electrically connected to the N+ source region 35. The N+ source region 35 is on a side of the trench gate electrode. In short, the source bump is electrically connected to the N+ source region 35 on a side of the trench gate electrode. There is a gate insulating film 31 between the first trench gate electrodes 51 and the source region 35.

As illustrated in FIG. 3A, there may be a protection layer or passivation layer 20 to protect integrated circuits (not illustrated) in the substrate from external air or moisture. As the protection layer 20, silicon nitride film may be used. The protection layer 20 overlaps each electrode. In addition, in order to facilitate the formation of first and second source bumps 71, 72, there is a polyimide layer 30 is on a protection layer 20.

As described above, embodiments provide a type of semiconductor die having a stacking structure of silicon-metallic conductive layer-silicon. Generally, Silicon On Insulator (SOI) wafer has an insulating film between substrates. However, embodiments may have a structure in which a metallic conductive layer 120 is inserted instead of the insulating film. A bidirectional current path may be formed using the metallic conductive layer 120. Since there is no process for forming a back side grinding and a back metal layer, stress on the semiconductor die 200 during a subsequent process may decrease. The insertion of metallic conductive layer 120 may lead to implementation of low on-resistance ($R_{on}$) and on-resistance between sources ($R_{s\text{-}son}$). In embodiments, a semiconductor die may therefore have a stacking structure that only includes a first semiconductor layer disposed over a second semiconductor layer, and a metallic layer between the first semiconductor layer and the second semiconductor layer; and which does not include an insulating layer or any other layers.

As illustrated in FIG. 3A, electrons entered through the first source electrode 11 pass through the first channel region 41 and then arrive in the metallic conductive layer 120. The electrons in the metallic conductive layer 120 move to the first semiconductor layer 101 due to voltage difference. The electrons move again through the second channel region 42, second source electrode 12, and second source bump 72.

On the contrary, if electrons are entered through the second source electrode 12, electrons move using a path of opposite direction. That is, electrons arrive in the metallic conductive layer 120 after passing through the second channel region 42. The electrons in the metallic conductive layer 120 move the first semiconductor layer 101 due to voltage difference. The electrons move again through the first channel region 41, first source electrode 11, and first source bump 71. The first semiconductor layer 101 may be referred to as a drift region because it becomes a path in which electrons or holes move. As described above, a bidirectional current path is possible. It is understood that the movement path of a hole carrier is the opposite to the movement path of an electron carrier.

FIG. 3B is a cross section of a semiconductor die having a stacking structure of silicon-metallic conductive layer-silicon according to an embodiment. FIG. 3B is a cross section of FIG. 2B along line 3B-3B'.

A semiconductor die 200 according to an embodiment includes a plurality of gate bumps and a plurality of source bumps in a first semiconductor layer. The difference of FIG. 3B to FIG. 3A is first and second source solder balls 81, 82 are further formed in first and second source bumps 71, 72. The other elements of FIG. 3B are similar to those of FIG. 3A, so the description of the rest of the elements is omitted.

Figure 4A:
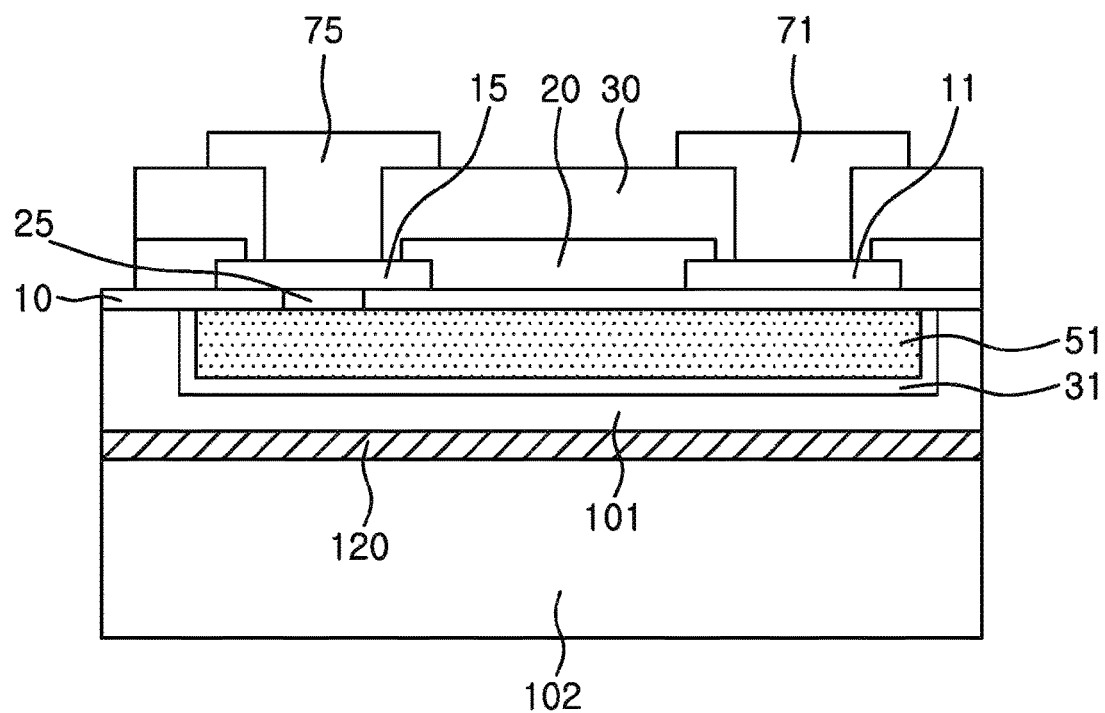
FIGS. 4A and 4B are cross sections illustrating an embodiment of a semiconductor die having a stacking structure of silicon-metallic conductive layer-silicon.
Figure 4B:
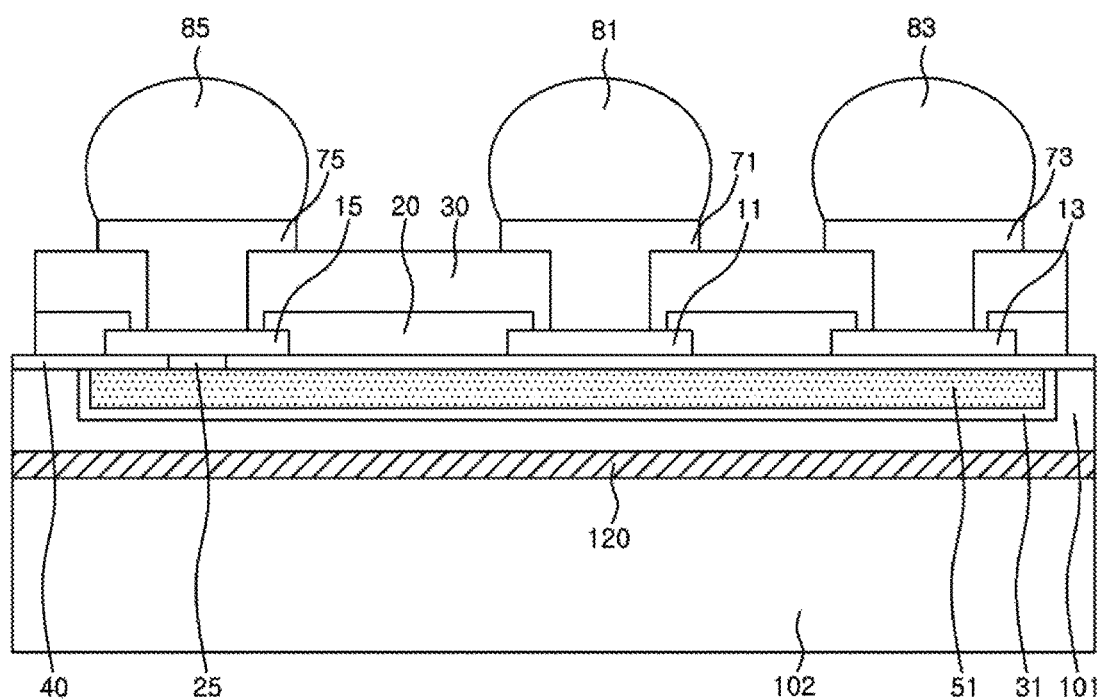

FIGS. 4A and 4B are cross sections illustrating an embodiment of a semiconductor die having a stacking structure of silicon-metallic conductive layer-silicon.

FIG. 4A is a cross section of FIG. 2A along line 4A-4A'. As illustrated in FIG. 4A, a semiconductor die 200 according to an embodiment includes a first source electrode 11 and a first source bump 71 which are electrically connected to each other. The semiconductor die 200 includes a first trench gate electrode 51 a first gate pad 15, and a first gate bump 75, which are electrically connected. The first trench gate electrode 51 is electrically connected to the first gate pad 15 and first gate bump 75 through a gate contact plug 25. Here, the first trench gate electrode 51 is formed under the first source electrode 11 or first gate pad 15. That is, it is very long in the lateral direction because the trench gate structure is formed in a stripe shape. An interlayer insulating film 10 is formed on a first trench gate electrode 51, and thus, it is insulated from the first source electrode 11 by the interlayer insulating film 10.

As illustrated in FIG. 7, the first source electrode 11 is electrically connected to the first source bump 71.

FIG. 4B is a cross section of a semiconductor die according to an embodiment. FIG. 4B is a cross section of FIG. 2B along line 4B-4B'.

As illustrated in FIG. 4B, a semiconductor die 200 according to an embodiment includes a first source electrode 11, a first source bump 71, and a first source solder ball 81 which are electrically connected to each other. The semiconductor die 200 further includes a first gate electrode 51, a first gate pad 15, a first gate bump 75, and a first gate solder ball 85. A gate insulating layer 31 is formed on a side of trench structure. The difference of FIG. 4B to 4A is a plurality of solder balls 81, 83, 85 are included. If necessary, a solder ball may be used depending on packaging type.

Figure 5:
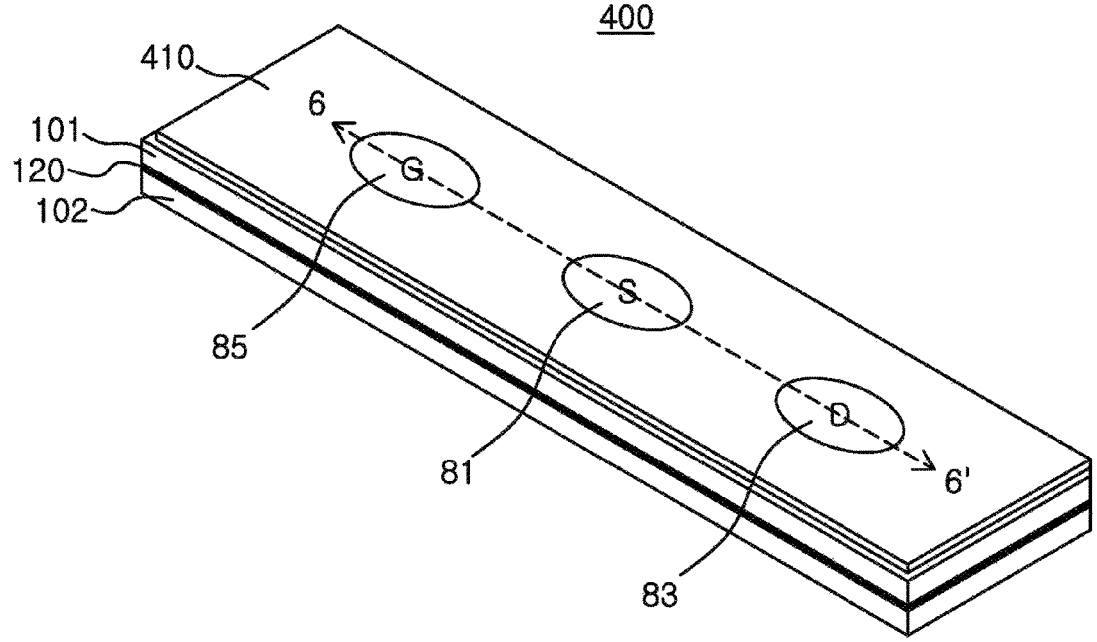
FIG. 5 is a perspective diagram illustrating another embodiment of a semiconductor die having a stacking structure of silicon-metallic conductive layer-silicon.

FIG. 5 is a perspective diagram illustrating another embodiment of a semiconductor die having a stacking structure of silicon-metallic conductive layer-silicon.

The above described embodiments are examples in which a bidirectional current path is possible, whereas FIG. 5 is an embodiment in which only a unidirectional current path is possible.

As illustrated in FIG. 5, a semiconductor die 400 having a stacking structure of silicon-metallic conductive layer-silicon includes a first semiconductor layer 101, a metallic conductive layer 120, and a second semiconductor layer 102 according to another embodiment. The semiconductor die 400 includes a power semiconductor device 410 formed in the first semiconductor layer. In the semiconductor die 400, there are a first gate solder ball 85, a first source solder ball 81, and a drain solder ball 88.

Figure 6:
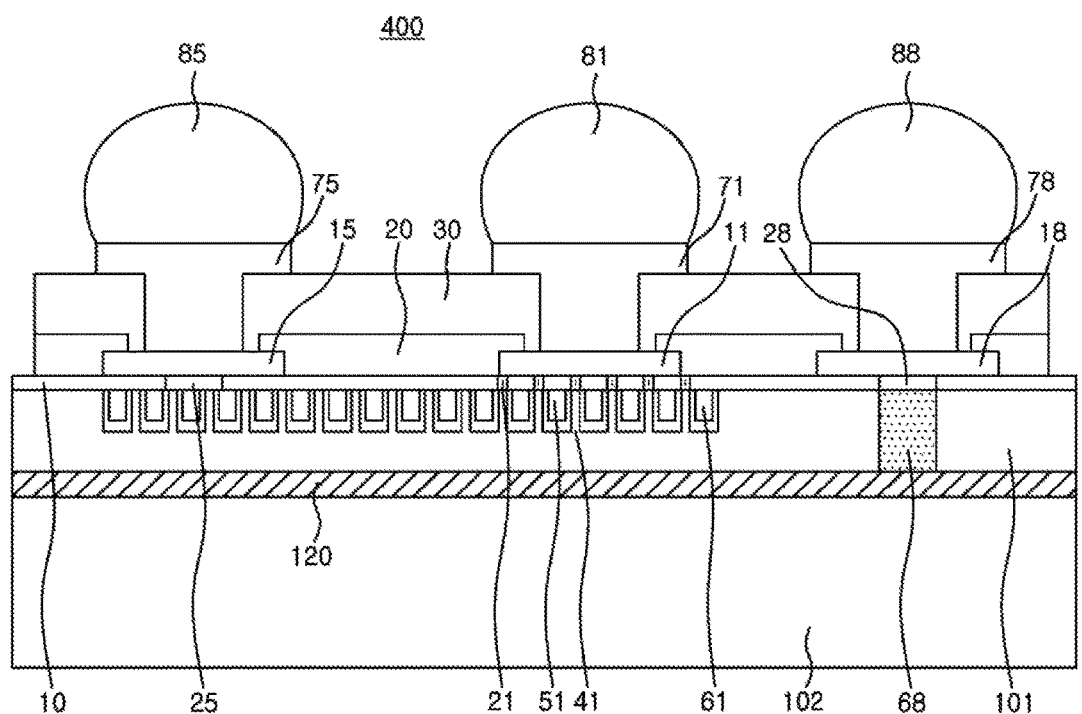
FIG. 6 is a cross section illustrating another embodiment of a semiconductor die having a stacking structure of silicon-metallic conductive layer.

FIG. 6 is a cross section illustrating another embodiment of a semiconductor die having a stacking structure of silicon-metallic conductive layer-silicon. FIG. 6 is a cross section of FIG. 5 along line 6-6'.

As illustrated in FIG. 6, a semiconductor die 400 having a stacking structure of silicon-metallic conductive layer-silicon includes a first semiconductor layer 101, a metallic conductive layer 120, and a second semiconductor layer 102 according to another embodiment. The semiconductor die 400 further includes a power semiconductor device 410 formed in the first semiconductor layer.

The semiconductor die 400 includes a first gate electrode 51, a first gate pad 15, a first gate bump 75, and a first gate solder ball 85, which are electrically connected to each other. In addition, a gate insulating film 31 is formed on a side of the trench structure. The semiconductor die 400 includes a first source electrode 11, a first source bump 71, and a first source solder ball 81 which are electrically connected to each other. In addition, the semiconductor die 400 further includes a drain contact region 68, a drain electrode 18, a drain bump 78, and a drain solder ball 88 which are electrically connected to each other. The drain contact region 68 may be formed using a highly doped well region.

The first gate, first source, and drain solder balls 85, 81, 88 are separated on a substrate 101. A plurality of first trench gate electrodes 51 are under the first gate solder ball 85 and first source solder ball 81. Here, all of the first gate, first source, and drain solder balls 85, 81, 88 include metal material, so they may be referred to as metal solder balls.

The plurality of first trench gate electrodes 51 are needed for establishment of a channel. For example, there are a plurality of first trench gate electrodes 51 under a first source electrode 11, and a plurality of first channel regions 41 are between the plurality of first trench gate electrodes 51. In the same manner, a plurality of first trench gate electrodes 51 are under a first gate pad 15, and a plurality of first channel regions 41 are between the plurality of first trench gate electrodes 51. Here, the plurality of first trench gate electrodes 51 are electrically connected to the first gate pad 15, and the connection may be made using a gate contact plug 25 in an interlayer insulating film 10.

The first source electrode 11 is electrically connected to an N+ source region 35 (in FIG. 7). The N+ source region 35 is on a side of a trench gate electrode. In other words, the first source electrode 11 is electrically connected to the N+ source region 35 on a side of a trench gate electrode 51. There is a gate insulating film 31 between the trench gate electrode 51 and N+ source region 35.

Electrons entered through the first source electrode 11 pass through a first channel region 41 and reach a metallic conductive layer 120. Since the metallic conductive layer 120 is connected to a drain contact region 68, the electrons move through a drain electrode 18, drain bump 78, and drain solder ball 88.

FIG. 7 is a cross section illustrating a semiconductor die that magnifies around the source electrode in FIG. 3A or 3B. As illustrated in FIG. 7, a first source electrode 11 is electrically connected to an N+ source region 35, and the N+ source region 35 is formed on a side of a trench gate electrode 51. In other words, the first source electrode 11 is electrically connected to the N+ source region 35 on a side of the trench gate electrode 51 through a source contact plug 21. A gate insulating film 31 is between the trench gate electrode 51 and N+ source region 35. In addition, there is a channel region 41 between a plurality of trench gate electrodes 51, and the channel region 41 is a p-type body region. The p-type body region 41, which is the channel region 41, is a region doped with p-type dopant, and the plurality of p-type body regions 41 is electrically connected to the first source electrode 11 through the plurality of source contact plugs 21 in an interlayer insulating film 10. The interlayer insulating film 10 may include two insulating films of CVD oxide film and BPSG (or PSG) oxide film in order to electrically separate the gate electrode from the source electrode. As indicated above, an N+ source region 35 is not formed next to a first dummy trench gate electrode 61, so short circuit immunity may be improved. The structure serves as a passage through which short-circuit currents around the dummy trench gate electrode can be quickly removed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor die, comprising:
   a stacking structure comprising:
      a first semiconductor layer disposed over a second semiconductor layer; and
      a metallic conductive layer between the first semiconductor layer and the second semiconductor layer;
   first and second power semiconductor devices in the first semiconductor layer;
   a first source bump and a first gate bump on the first semiconductor layer;
   first trench gate electrodes under the first source bump;
   a first channel between the first trench gate electrodes;
   a second source bump and a second gate bump on the first semiconductor layer;

second trench gate electrodes under the second source bump; and a second channel between the second trench gate electrodes.

2. The semiconductor die of claim 1, further comprising:
a first barrier metal layer on a front side of the metallic conductive layer; and
a second barrier metal layer on a back side of the metallic conductive layer.

3. The semiconductor die of claim 1, wherein the first semiconductor layer has a thinner thickness than the second semiconductor layer, and is less than or equal to about 20 μm thick.

4. The semiconductor die of claim 1, wherein a bidirectional current path is disposed through the metallic conductive layer.

5. The semiconductor die of claim 1, wherein the first and second source bumps are electrically connected to a source region on a side of the trench gate electrodes.

6. The semiconductor die of claim 1, wherein the first and second source bumps are electrically connected to the first and second trench gate electrodes, respectively.

7. The semiconductor die of claim 1, further comprising:
first dummy trench gate electrodes adjacent to the first trench gate electrodes, and
second dummy trench gate electrodes adjacent to the second trench gate electrodes.

8. The semiconductor die of claim 1, further comprising third and fourth source bumps on the first semiconductor layer.

9. The semiconductor die of claim 1, further comprising:
a first source electrode connected to the first source bump; and
a second source electrode connected to the second source bump.

10. The semiconductor die of claim 9, further comprising:
a first solder ball connected to the first source bump; and
a second solder ball connected to the second source bump.

11. The semiconductor die of claim 1, wherein the metallic conductive layer comprises graphene.

* * * * *

UNITED STATES PATENT AND TRADEMARK OFFICE
CERTIFICATE OF CORRECTION

PATENT NO. : 10,276,673 B2  
APPLICATION NO. : 15/901235  
DATED : April 30, 2019  
INVENTOR(S) : Myung Ho Park et al.

Page 1 of 1

It is certified that error appears in the above-identified patent and that said Letters Patent is hereby corrected as shown below:

On the Title Page

Item (72) Inventors: Second inventor's name "Ui Kyu Seo" should read --Ul Kyu Seo--

Signed and Sealed this  
Sixth Day of August, 2019

Andrei Iancu  
*Director of the United States Patent and Trademark Office*